(12) United States Patent
Lin

(10) Patent No.: US 7,714,374 B2
(45) Date of Patent: May 11, 2010

(54) STRUCTURE AND FABRICATION METHOD OF FLASH MEMORY

(75) Inventor: Sung-Bin Lin, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 327 days.

(21) Appl. No.: 11/939,720

(22) Filed: Nov. 14, 2007

(65) Prior Publication Data

US 2009/0121278 A1    May 14, 2009

(51) Int. Cl.
*H01L 29/94* (2006.01)

(52) U.S. Cl. .................. 257/314; 257/315; 257/316; 257/317; 257/320; 257/321; 257/322; 257/326

(58) Field of Classification Search ............. 257/314, 257/315, 316, 317, 320, 321, 322, 326
See application file for complete search history.

(56) References Cited

U.S. PATENT DOCUMENTS

| | | | |
|---|---|---|---|
| 5,486,714 A | 1/1996 | Hong | |
| 6,025,635 A * | 2/2000 | Krivokapic | 257/412 |
| 6,448,607 B1 | 9/2002 | Hsu et al. | |
| 6,762,955 B2 | 7/2004 | Sakui et al. | |
| 7,488,660 B2 * | 2/2009 | Dyer et al. | 438/300 |
| 2002/0071315 A1 | 6/2002 | Hsu et al. | |
| 2004/0232472 A1 | 11/2004 | Sakui et al. | |
| 2006/0043457 A1* | 3/2006 | Baik | 257/314 |

* cited by examiner

*Primary Examiner*—Long K Tran
(74) *Attorney, Agent, or Firm*—Winston Hsu

(57) ABSTRACT

A method for forming a flash memory cell and the structure thereof is disclosed. The flash memory cell includes a substrate, a first raised source/drain region and a second raised source/drain region separated by a trench in-between, a first charge-trapping spacer and a second charge-trapping spacer respectively on the sidewall of the first and second raised source/drain region, a gate structure covering the first and second spacers, the trench and the first and second raised source/drain regions and a gate oxide layer located between the gate structure and the first and second raised source/drain regions and the substrate. By forming the charge-trapping spacers with less e-distribution, the flash memory affords better erasure efficiency.

13 Claims, 6 Drawing Sheets

STRUCTURE AND FABRICATION METHOD OF FLASH MEMORY

BACKGROUND OF THE INVENTION

1. Field of the Invention

The present invention relates to a method for fabricating a flash memory cell. More particularly, the present invention relates to a method for fabricating a SONOS flash memory cell and the structure thereof.

2. Description of Related Art

Flash memory can perform programming, erasing and reading many times and can retain information even when power is interrupted, so it is widely used in personal computers and electrical apparatus. The typical flash cell is an erasable programmable read-only memory with tunnel oxide (ETOX) cell. The ETOX cell is programmed by channel hot-electron (CHE) effects and is erased by Fowler-Nordheim (F-N) tunneling effects through the source side.

Moreover, the floating gate and the control gate of the ETOX cell are made of doped polysilicon. The electrons injected into the polysilicon floating gate are delocalized when the memory cell is programmed. However, if there are defects in the tunneling oxide under the polysilicon floating gate of the ETOX cell, current leakage of the device occurs easily, thus affecting the reliability of the device.

Therefore, in order to solve the problem of the gate induced drain leakage current of the ETOX memory cell, a flash memory cell with silicon-oxide/nitride/oxide-silicon (SONOS) structure has been provided. The SONOS flash memory cell comprises a charge trapping layer to replace the polysilicon floating gate. The charge trapping layer is comprised of silicon oxide/nitride/silicon oxide (ONO) layers. Since the charge trapping layer is a dielectric layer, the hot carriers injected into the charge trapping layer are localized and have a Gauss distribution. For this reason, the sensitivity of the memory cell toward the defects in the tunneling oxide layer is smaller and the phenomenon of the gate induced drain leakage current is reduced.

SUMMARY OF THE INVENTION

The present invention provides a flash memory cell having the SONOS structure formed on the sidewalls of the raised source/drain regions. The flash memory cell affords better erasure efficiency.

The present invention also provides a method for forming a SONOS flash memory. The method can be compatible with the present CMOS manufacturing process and provides larger fabrication window for the memory cell.

The present invention provides a method for forming a flash memory with SONOS structure. According to the embodiment of the present invention, a substrate having at least a doped region therein is provided and a plurality of trenches is formed within the doped region. A plurality of charge-trapping spacers is formed on sidewalls of the trenches. After forming a gate oxide layer, a patterned polysilicon layer is formed over the substrate to fill up the trenches and to cover the charge-trapping spacers and the gate oxide layer.

Because the charge-trapping spacers and the gate oxide layer are formed separately, the rule limitation regarding the gate oxide layer will not affect the fabrication of the charge-trapping spacers. In this way, different layers or elements can be tuned independently for better device performance.

The present invention also provides a flash memory and a flash memory cell with SONOS structure, which has less electron-distribution and less local electrical field effect depletion during operation.

According to the embodiment of the present invention, the flash memory comprises a substrate, a plurality of raised source/drain regions on the substrate, a plurality of charge-trapping spacers on sidewalls of the raised source/drain regions, a plurality of gate structures covering the charge-trapping spacers and the raised source/drain regions; and an oxide layer located between the gate structure and the raised source/drain regions and between the gate structure and the substrate. The charge-trapping spacer is comprised of a composite oxide/nitride/oxide (ONO) layer and the nitride layer of the charge-trapping spacer functions as the charge storage layer for the memory.

The flash memory of the present invention offers better operation efficiency as charges are stored at two separate smaller regions of the spacers on two opposing sidewalls.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

In the drawings, FIGS. 1A-1F display cross-sectional views of the manufacturing processes for a SONOS flash memory cell according to a preferred embodiment of the present invention.

FIG. 2A displays a top view of the SONOS flash memory cell according to a preferred embodiment of the present invention, while

DESCRIPTION OF THE PREFERRED EMBODIMENTS

Figure 1A:
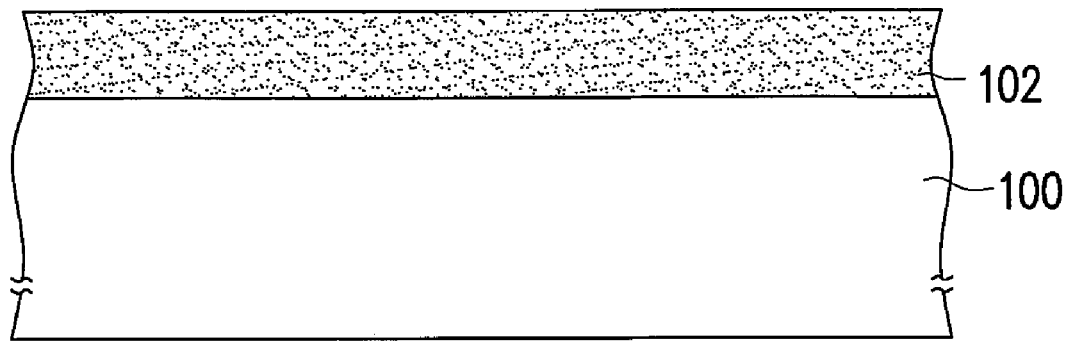

FIGS. 1A-1F display cross-sectional views of the manufacturing processes for a SONOS flash memory cell according to a preferred embodiment of the present invention. Referring to FIG. 1A, a substrate 100, for example, a silicon substrate, is provided with at least a buried doped region 102. As the manufacturing processes for a SONOS flash memory cell according to a preferred embodiment of the present invention is compatible with the MOS manufacturing process, the doped region 102 can be formed at the same time as the process of defining the device areas or forming well regions. For example, if the substrate 100 is a p-type substrate, the doped region 102 can be N+ doped region formed by implanting N+ type dopants having a dosage level of about $10^{15}$ atoms/cm$^3$ in the substrate 100.

Figure 1B:
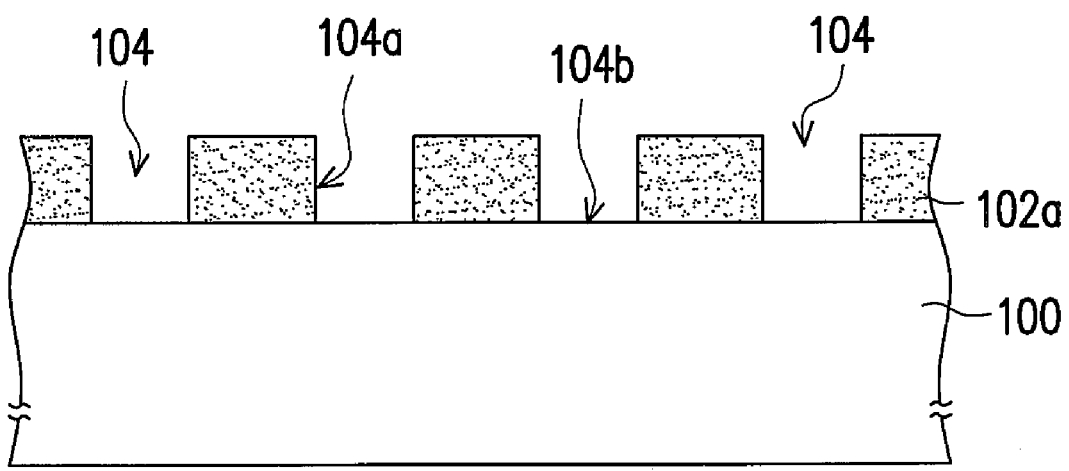

Referring to FIG. 1B, trenches 104 are formed in the substrate 100 during the process of forming shallow trench isolation in the MOS manufacturing process. The patterns of the trenches 104 further define the bit lines for the memory cell array. The trenches 104 are formed by the anisotropic etching process with a depth of about 400-1250 Angstroms, for example. Preferably, the depth of the trenches 104 is about 500-1000 Angstroms. The remained doped region 102a functions as source/drain regions of the memory cell.

Figure 1C:
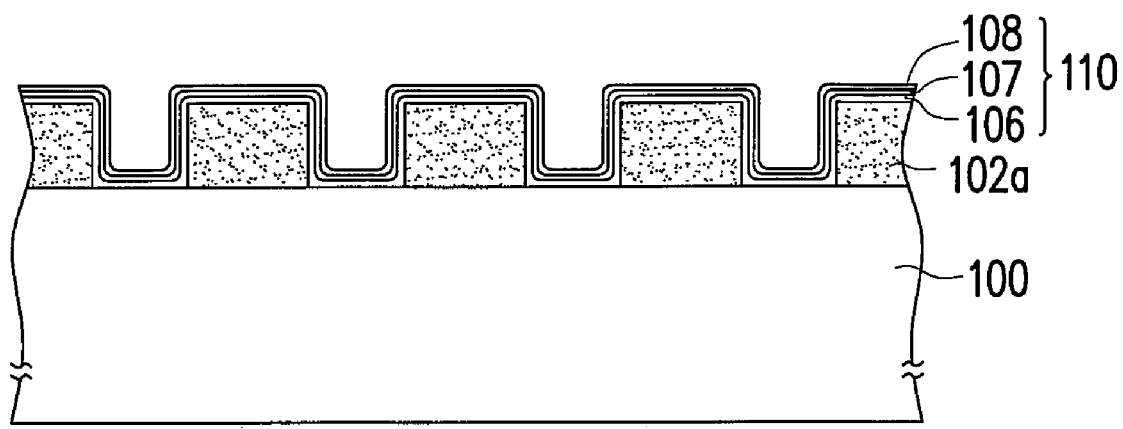

Referring to FIG. 1C, a charge-trapping layer 110, preferably, an oxide/nitride/oxide (ONO) composite layer is conformally formed over the substrate 100, and covering the sidewalls 104a and bottom surfaces 104b (shown in FIG. 1B) of the trenches 104. For example, the charge-trapping layer 110 can be formed by sequentially forming a tunnel oxide layer 106, an intermediate trapping layer 107 and a top oxide layer 108 over the surface of the substrate 100. For example, the tunnel oxide layer 106 can be formed by thermal oxidation or chemical vapor deposition with a thickness of about 40-60 Angstroms and the top oxide layer 108 can be formed by chemical vapor deposition with a thickness of about 40-60 Angstroms, while the intermediate trapping layer 107 on the tunneling oxide layer 106 can be a silicon nitride layer having a thickness of about 40-60 angstroms and formed by chemical vapor deposition.

Figure 1D:
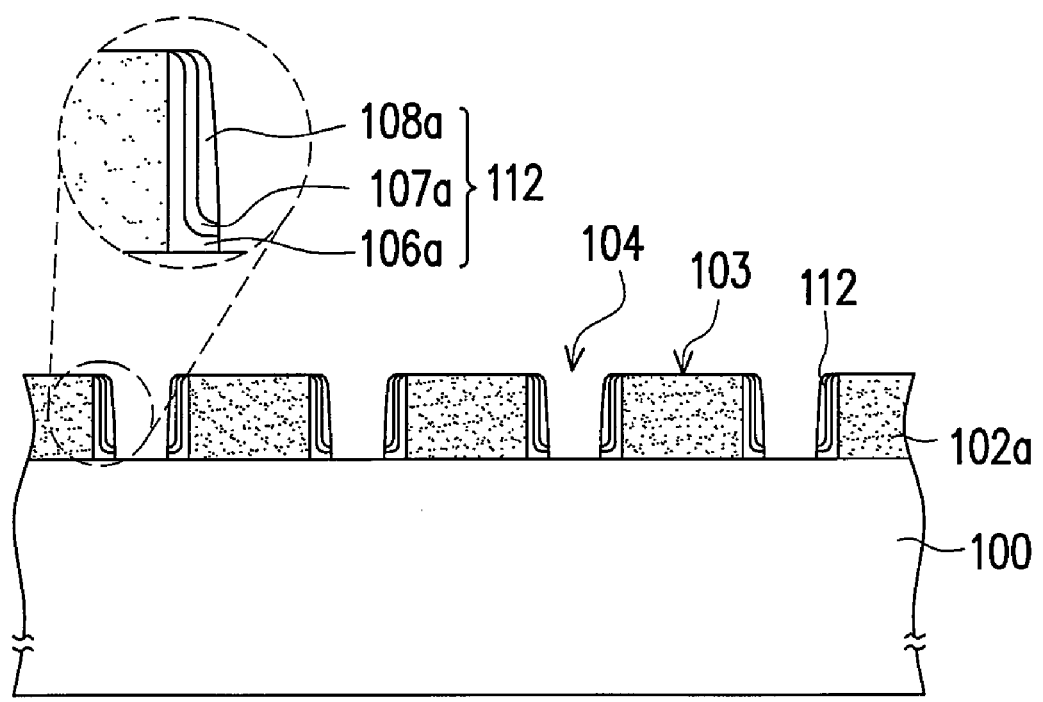
Figure 1C:
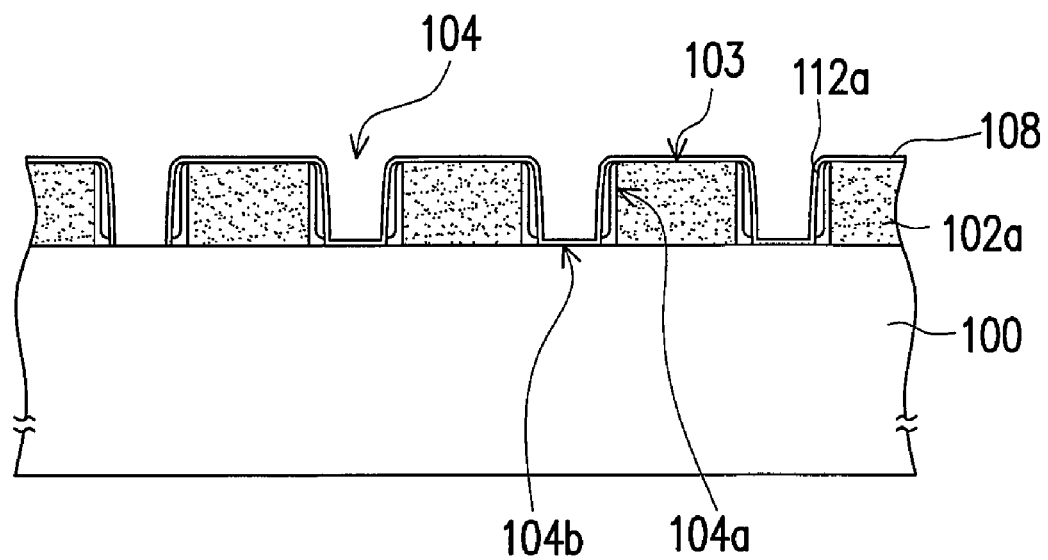
Figure 1D:
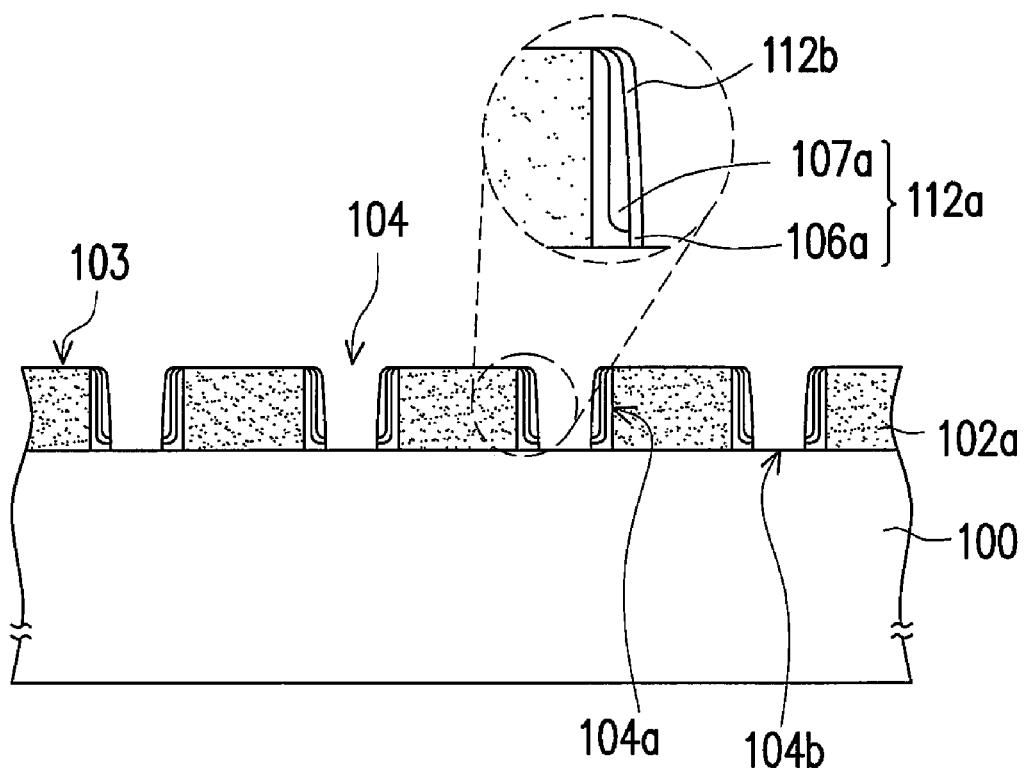

Referring to FIG. 1D, an etching back process is performed to the charge-trapping layer 110 (shown in FIG. 1C) to form spacers 112 on the sidewalls 104a of the trenches 104, while the bottom surfaces 104b (as shown in FIG. 1C') of the trenches 104 are exposed. The spacer 112 consists of the first oxide spacer 106a, the nitride spacer 107a and the second oxide spacer 108a, as shown in the above enlarged view. The nitride spacer 107a acts as the charge trapping region of the memory cell and only few charges are collected inside the nitride spacer 107a so that less e-distribution and less local electrical field effect drain depletion are achieved in comparison with conventional SONOS flash memory structure.

Alternatively, referring to FIG. 1C' and 1D', after forming the trenches 104, a tunnel oxide layer 106 and a trapping layer 107 are sequentially formed over the surface of the substrate 100 and then an etching back process is performed to form the lower spacers 112a on the sidewalls 104a of the trenches 104, but exposing the bottom surfaces 104b of the trenches 104. The nitride spacer 107a of the lower spacer 112a acts as the charge-trapping region of the memory cell. As shown in FIG. 1C', a top oxide layer 108 is later formed over the substrate 100 to conformally cover the lower spacers 112a and the bottom surfaces 104b of the trenches 104.

As shown in FIG. 1D', an etching back process is performed to the top oxide layer 108 until the bottom surfaces 104b of the trenches 104 are exposed, so that spacers 112 (see FIG. 1E, the entire spacers) consisting of the upper spacers 112b and the lower spacers 112a are formed on the sidewalls 104a of the trenches 104, as shown in the below enlarged view.

Figure 1E:
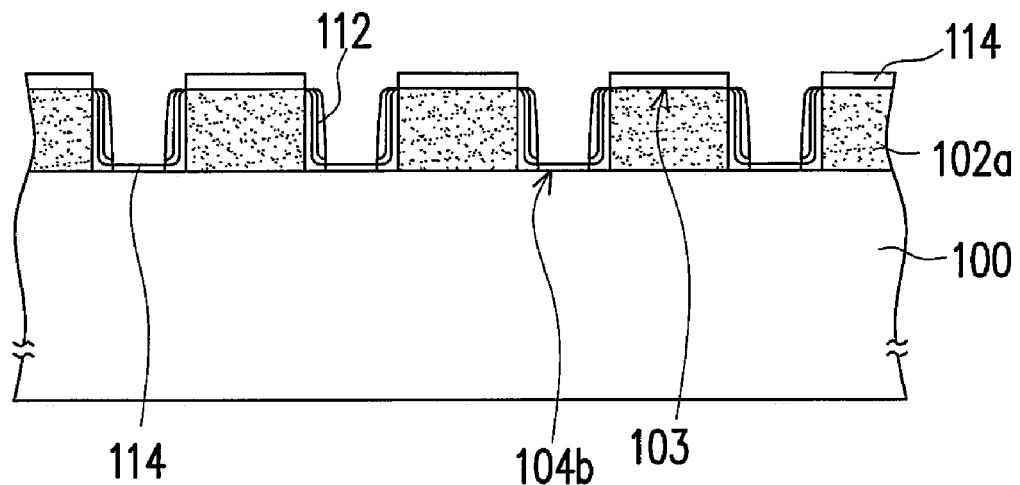

Referring to FIG. 1E, following FIG. 1D or 1D', a gate oxide layer 114 is formed on the exposed bottom surfaces 104b of the trenches and on top surfaces 103 of the doped region 102a. The gate oxide layer 114 can be formed by thermal oxidation with a thickness of about 40-60 Angstroms, for example.

Figure 1F:
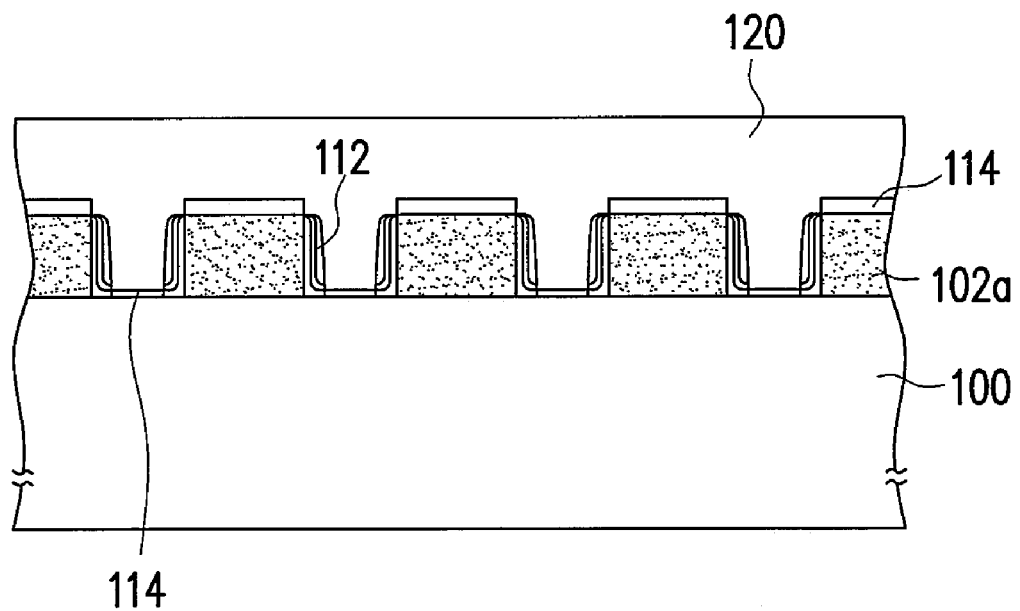

Referring to FIG. 1F, a polysilicon layer 120 is formed over the substrate 100, filling up the trenches 104 and covering the spacers 112 and the gate oxide layer 114. The polysilicon layer can be formed by chemical vapor deposition, for example. The polysilicon layer 120 acts as the gate for the memory.

Subsequently, a photolithographic and etching process is carried out to pattern the polysilicon layer 120. During the photolithographic and etching process, portions of the underlying spacers or gate oxide layer can also be removed.

Figure 2A:
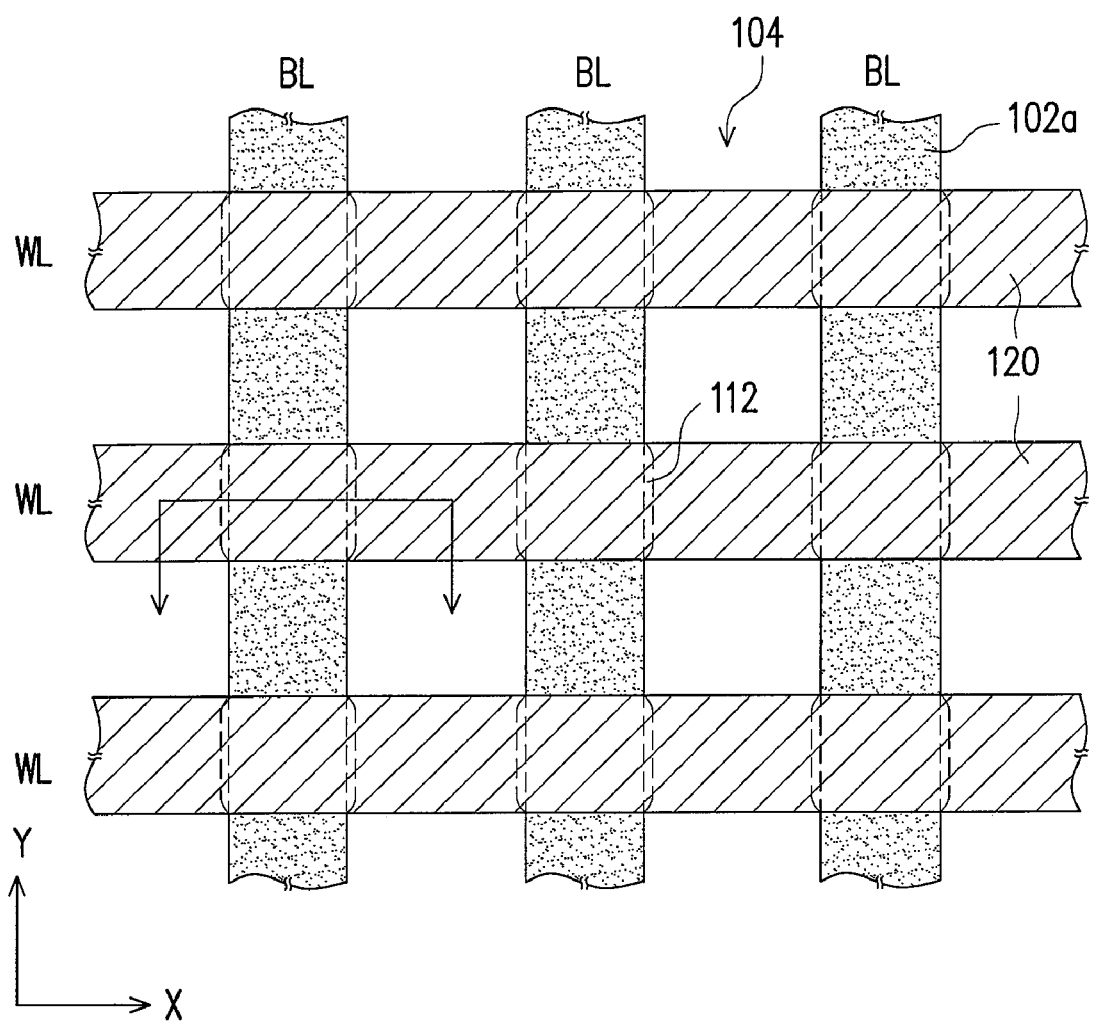
Figure 2B:
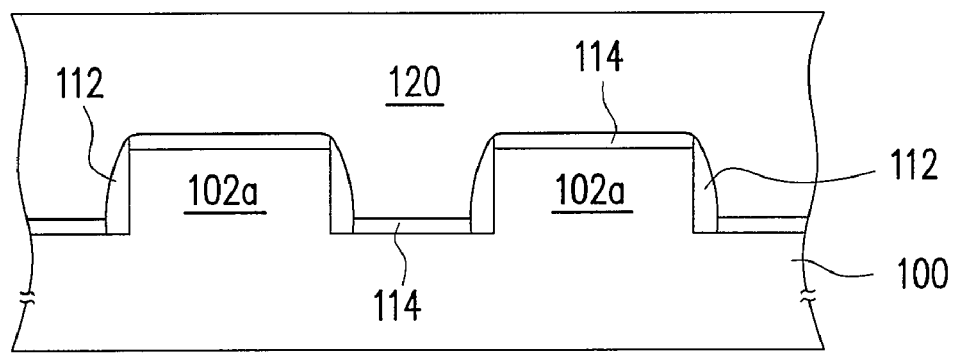
FIG. 2B is a cross-sectional view of the structure in FIG. 2A along the line I-I'.

FIG. 2A displays a top view of the SONOS flash memory cell according to a preferred embodiment of the present invention, while FIG. 2B is a cross-sectional view of the structure in FIG. 2A along the line I-I'. As shown in FIG. 2A, the doped regions 102a were defined as strip structures in parallel (extending in Y direction) by the trenches 104, while the polysilicon layer 120 is patterned as strip structures in parallel (extending in X direction). The strip structures of the polysilicon gate layer 120 function as word lines (WL) and run across above the bit lines (BL, i.e. doped region 102a). The ONO spacers 112, underneath the polysilicon layer 120, are located on two opposite sidewalls of the trenches 104. Referring to FIG. 2B, the ONO spacers 112 are located between the polysilicon layer 120 (acting as a control gate) and the doped regions 102a (acting as the raised source/drain regions) and the nitride layers of the spacers 112 function as the charge-trapping region for the memory cell. The gate oxide layer 114 is located between the polysilicon layer 120 and the remained doped region 102a and located between the polysilicon layer 120 and the substrate 100.

Figure 3:
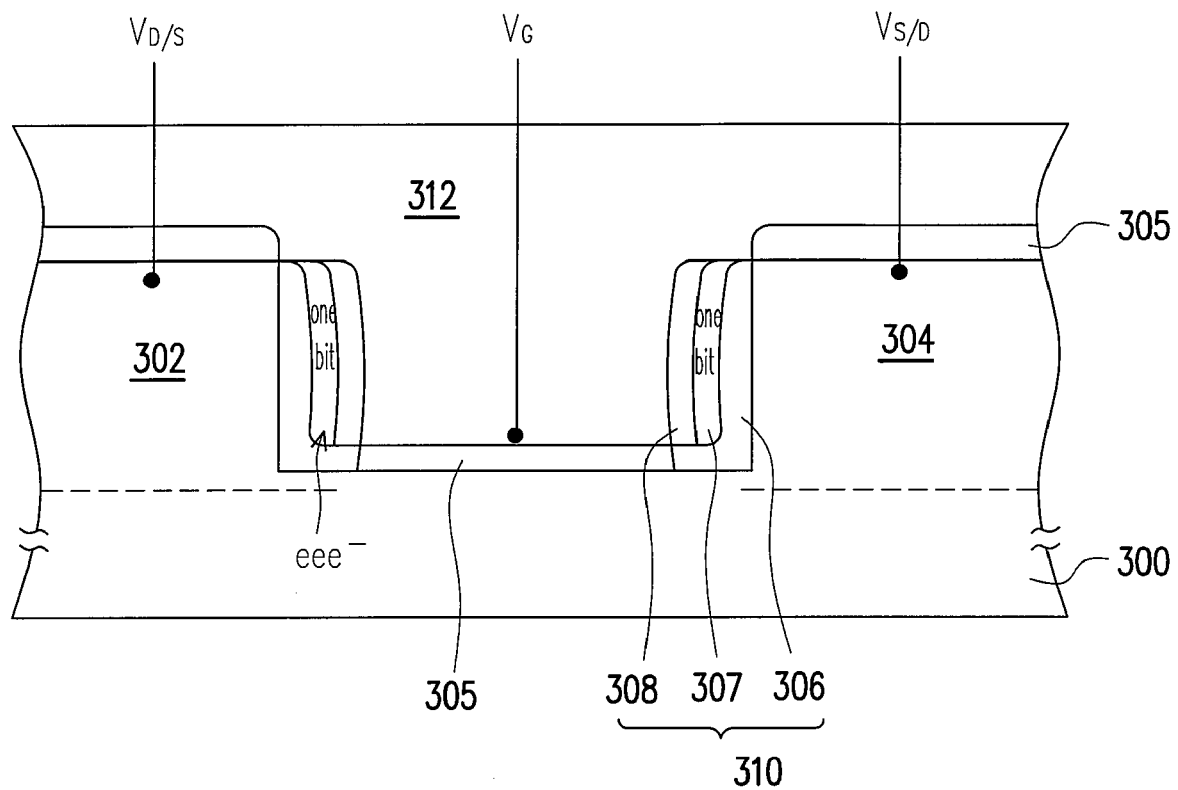
FIG. 3 is a cross-sectional display view of a SONOS flash memory cell.

FIG. 3 is a cross-sectional display view of a SONOS flash memory cell. As shown in FIG. 3, the memory cell 30 comprises a substrate 300, for example, a p-type substrate, a source/drain region 302 and a source/drain region 304, for example, N+ type doped regions in the substrate 300. A stacked spacer structure 310 is located on the sidewalls of the raised source/drain regions 302/304, wherein the stacked spacer structure 310 consists of a bottom oxide layer 306, a nitride layer 307, and a top oxide layer 308. The control gate 312 covers the stacked spacer structures 310 and a gate oxide layer 305 is located between the control gate 312 and the source/drain regions 302/304.

During programming (by the hot carrier effect), a high voltage is applied to the gate 312 and the source/drain region 302. Hot electrons would penetrate through the oxide layer 306 and become trapped in the nitride layer 307 of the structure 310 on the sidewall of the source/drain region 302 in the nitride layer 307, namely, the region for trapping the left bit of memory cell 30. Similarly, during programming by reverse operation, electrons can become trapped in the nitride layer 307 of the stacked structure 310 on the sidewall of the source/drain region 304 for the right bit of the memory cell 30.

Compared with the prior continuous charge trapping layer, the diminutive charge-trapping regions that are two separate and smaller regions within the spacers at sidewalls of the raised source/drain regions can trap fewer electrons, leading to less e-distribution and less local electrical field effect drain depletion during operation.

During erasing, the hot holes enhanced injection mechanism is used to erase the programmed SONOS memory. As these operation mechanisms are known by the skilled artisans, details will not be further described hereinafter.

According to the preferred embodiment of this invention, the erasure efficiency of the SONOS memory of this invention is better due to the electron (or charge) distribution pattern in the SONOS memory cell of this invention. In the prior art, the charges are distributed in the entire nitride layer of the stacked gate structure in the conventional memory cell, leading to incomplete erasure or inferior erasure efficiency. On the other hand, in the SONOS memory of this invention, the electrons are trapped or stored at two separate charge trapping regions (the nitride layer of ONO spacers on two opposite sidewalls of the raised source/drain regions) and the electron distribution is therefore more concentrated, thus leading to higher erasure efficiency and better device performance.

According to the preferred embodiment of this invention, since the gate oxide layer is formed separately from the steps of forming the oxide layer or the spacers, the thickness of the oxide layer of the spacer can be adjusted or tuned independently, regardless the fabrication of the gate oxide layer. In this case, the fabrication window of the ONO spacer can be larger and the thickness of the oxide layer for the spacers can be tuned down without decreasing the thickness of the gate oxide layer.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A structure of a flash memory, comprising:
    a substrate;
    a plurality of raised source/drain regions on the substrate;
    a plurality of charge-trapping spacers on sidewalls of the raised source/drain regions;
    a plurality of gate structures covering the charge-trapping spacers and the raised source/drain regions; and
    an oxide layer located between the gate structure and the raised source/drain regions and between the gate structure and the substrate, wherein the gate structures are strip structures in parallel that function as word lines and run across above the raised source/drain regions that function as bit lines.

2. The structure of claim 1, wherein each of the charge-trapping spacers consists of a composite oxide/nitride/oxide (ONO) structure.

3. The structure of claim 2, wherein the composite oxide/nitride/oxide (ONO) structure comprises a tunnel oxide layer of about 40-60 angstroms, a silicon nitride layer of about 40-60 angstroms and a top oxide layer of about 40-60 angstroms.

4. The structure of claim 1, wherein portions of the raised source/drain regions are overlapped with the gate structures and the charge-trapping spacers are disposed beneath the gate structures and right on the sidewalls of the overlapped portions of the raised source/drain regions.

5. The structure of claim 4, wherein the word lines are perpendicular to the bit lines.

6. The structure of claim 1, wherein the raised source/drain regions are strip structures arranged in parallel and with trenches in-between, and portions of the word lines are disposed within the trenches between the raised source/drain regions and covering the dielectric spacers.

7. The structure of claim 6, wherein the word lines are perpendicular to the bit lines.

8. The structure of claim 6, wherein a height of the raised source/drain regions is about 500-1000 angstroms and a depth of the trenches is about the same as the height of the raised source/drain regions.

9. A flash memory cell, comprising:
    a substrate;
    a first raised source/drain region on the substrate;
    a second raised source/drain region on the substrate, wherein the first and second raised source/drain regions are separated by a trench in-between;
    a first spacer on a sidewall of the first raised source/drain region;
    a second spacer on a sidewall of the second raised source/drain region, wherein the first and second spacers are disposed on the opposite sidewalls of the trench;
    a gate structure covering the first and second spacers, the trench and the first and second raised source/drain regions; and
    a gate oxide layer located between the gate structure and the first and second raised source/drain regions and between the gate structure and the substrate.

10. The structure of claim 9, wherein the first spacer consists of a composite oxide/nitride/oxide (ONO) structure.

11. The structure of claim 10, wherein the composite oxide/nitride/oxide (ONO) structure comprises a tunnel oxide layer of about 40-60 angstroms a silicon nitride layer of about 40-60 angstroms and a top oxide layer of about 40-60 angstroms.

12. The structure of claim 9, wherein the second spacer consists of a composite oxide/nitride/oxide (ONO) structure.

13. The structure of claim 12, wherein the composite oxide/nitride/oxide (ONO) structure comprises a tunnel oxide layer of about 40-60 angstroms, a silicon nitride layer of about 40-60 angstroms and a top oxide layer of about 40-60 angstroms.

* * * * *